United States Patent [19]
Kim

[11] Patent Number: 5,696,559
[45] Date of Patent: Dec. 9, 1997

[54] DEVICE FOR CORRECTING DC OF HDTV

[75] Inventor: Dae Jin Kim, Kyungki-do, Rep. of Korea

[73] Assignee: Goldstar Co., Ltd., Seoul, Rep. of Korea

[21] Appl. No.: 371,393

[22] Filed: Jan. 11, 1995

[30] Foreign Application Priority Data

Apr. 12, 1994 [KR] Rep. of Korea ............... 7634/1994

[51] Int. Cl.⁶ .................................................. H04N 5/91
[52] U.S. Cl. .......................... 348/691; 348/720; 348/725
[58] Field of Search .......................... 348/691, 571, 348/692, 720, 725, 572; H04N 5/44, 5/91, 7/015, 5/16

[56] References Cited

U.S. PATENT DOCUMENTS 5,341,218  8/1994  Kaneko et al. ............... 348/691 X Primary Examiner—John K. Peng
Assistant Examiner—Nathan J. Flynn
Attorney, Agent, or Firm—Fish & Richardson P.C.

[57] ABSTRACT

This invention relates to a device for correcting DC of a HDTV, which can correct DC(Direct Current) that is liable to cause in mixers, base band amplifiers and ADC(Analog/Digital Converter) for a HDTV receiver. The device includes a non-interference DC detector for detecting DC from digital signals of an I channel and a Q channel applied under non-interference conditions in which an IF signal input has been cut off. An interference DC detector for detecting DC from the digital signals of an I channel and a Q channel applied at every field according to data field synchronization signal applied from outside. A selection part for selecting either one of the DC values received from the non-interference DC detector and the interference DC dectector. And, a D/A conversion part for D/A conversion of the DC value received from the selection part. Whereby, the DC value varying with time can be corrected by using field synchronization data and without turning the switch of IF terminal off.

12 Claims, 4 Drawing Sheets

DEVICE FOR CORRECTING DC OF HDTV

FIELD OF THE INVENTION

This invention relates to a device for correcting DC of a HDTV, which can correct DC(Direct Current) that is liable to cause in mixers, base band amplifiers and ADC(Analog/Digital Converter) for a HDTV receiver.

BACKGROUND OF THE INVENTION

In general, since the signal received through an antenna causes DC in the processes passing through mixers, base band amplifiers and ADCs for modulation into base band signal and conversion into digital signal, which DC should be corrected for being restored into original signal through accurate filtering, the device for correcting DC is indispensable for a HDTV.

Shown in FIG. 1 is a system of a conventional HDTV receiver.

As shown in FIG. 1, a conventional HDTV receiver includes a tuner 1 for selection of a desired channel in response to an applied channel tuning signal and a delayed AGC(Auto Gain Control) signal and for primary demodulation of the selected signal into 920 MHz band signal, a local oscillator 2 which generates a signal of 876 MHz frequency for secondary demodulation of the signal, primarily demodulated in the tuner 1, into a signal of secondary intermediate frequency (IF, hereinafter called 'IF') of 44 MHz band, a SAW filter 3 for filtering the signal converted into secondary IF signal of 44 MHz into a VSB(Vestigial Side Band) wave pattern, a noninterference DC switch 4 switched in response to a noninterference DC signal received from outside for passing the signal received from the SAW filter 3, an IF amplifier 5 for amplifying the IF signal transmitted through the noninterference switch 4 under the control of the AGC signal, a synchronization detector 7 for division of the signal received from the IF amplifier into an I channel signal and a Q channel signal and tertiary demodulation of the divided signals into base band signals, a local oscillator 6 for generating frequency signals and transmitting the generated frequency signals to the synchronization detector 7, an LPF(Low Pass Filter, hereinafter called 'LPF') 8 for filtering the I channel signal received from the synchronization detector 7 to pass 6 MHz signal only, an LPF 9 for filtering the Q channel signal received from the synchronization detector 7 to pass 6 MHz signal only, a DC correction device 14 for carrying out DC correction in response to the non-interference DC signal received from outside to generate a DC correction value, a subtracter 10 for subtracting the DC correction value received from the DC correction device 14 from the signal received from the LPF 8, a subtracter 11 for subtracting the DC correction value received from the DC correction device 14 from the signal received from the LPF 9, an ADC 12 for A/D converting the signal received from the subtracter 10 into a digital signal with a sampling frequency of 10.76 MHz and applying the converted digital signal to the DC correction device 14, an ADC 13 for A/D converting the signal received from the subtracter 11 into a digital signal with a sampling frequency of 10.76 MHz and applying the converted digital signal to the DC correction device 14, a data segment synchronization detector 16 for detecting data segment synchronization from the signal received from the ADC 12, a data field synchronization detector 17 for detecting data field synchronization from the signal received from the data segment synchronization detector 16, and an FPLL (Frequency Phase Locked Loop) 15 for searching the signals received from the ADC 12 and 13 for phase differences to operate the local oscillator 2 for locking frequency and phase.

The synchronization detector 7 has a phase invertor 72 for inverting the phase of the signal received from the local oscillator 6 at 90 deg., a mixer 71 for mixing the signal received from the phase invertor 72 with the signal received from the IF amplifier 5 and applying the mixed signal to the LPF 8, and a mixer 73 for mixing the signal received from the local oscillator 6 with the signal received from the IF amplifier 5 and applying the mixed signal to the LPF 9.

The DC correction device 14 has a non-interference DC detector 141 for detecting non-interference DC value from the signal received from the ADC 12 and 13 in response to the noninterference DC signal received from outside, and DACs(Digital/Analog Converters) 142 and 143 for D/A converting the signal received from the non-interference DC detector 141 and applying the converted signals to the subtracters 10 and 11, respectively.

Operation of the conventional HDTV receiver having the foregoing system is to be explained hereinafter.

The signal is received from the antenna, and desired channel is selected by adjusting the gain at the tuner 1 in response to the channel tuning signal and the delayed AGC inputs. This signal is demodulated into a 920 MHz band by a primary local oscillator(not shown) in the tuner 1, and secondarily demodulated into the 44 MHz secondary intermediate frequency by the secondary local oscillator 2.

The signal is converted into the 44 MHz secondary intermediate frequency through the tuner 1, VSB filtered through the SAW filter 3 that filters a signal into a VSB wave pattern signal, and applied to the IF amplifier 5 through the non-interference DC switch 4. In this instant, the non-interference DC switch is turned off only in case of DC correction, and is always turned on in the absence of DC correction.

The signal is received through the non-interference DC switch 4, amplified at the IF amplifier 5 under the control of AGC signal, and divided into I channel signal and Q channel signal and tertiarily demodulated into base band signals at the synchronization detector 7 according to the signal received from the tertiary local oscillator 6.

That is, of the signals received from the IF amplifier 5, the I channel signal is tertiarily demodulated after a phase inversion of 90 deg. at the mixer 71 in response to the signals received both from the phase invertor 72 and the tertiary local oscillator 6, and the Q channel signal is tertiarily demodulated at the mixer 73 according to the signal received from the local oscillator 6.

The I channel signal is received from the mixer 71 of the synchronization detector 7 by the LPF 8 and filtered, the DC correction value received from the DC correction device 14 is substracted at the subtracter 10, and the signal is A/O converted into a digital signal with a 10.76 MHz sampling frequency at the ADC 12.

And the Q channel signal is received from the mixer 73 of the synchronization detector 7 by the 6 MHz LPF 9 and filtered, the DC correction value received from the DC correction device 14 is subtracted at the subtracter 11, and the signal is A/D converted into a digital signal with a 10.76 MHz sampling frequency at the ADC 13.

Digital signals, including both frequency and phase, are received from the ADCs 12 and 13 are detected at the FPLL 15 to operate the secondary local oscillator 2 for locking the frequencies and phases.

Digital signals received from the ADCs 12 and 13 are also applied to the DC correction device 14 for correcting DC.

That is, the DC components of the digital signals received from the ADCs 12 and 13 are detected at the non-interference DC detector 141 in response to the non-interference DC signal received from outside.

Operation detail of the DC correction device is to be explained hereinafter.

To detect DC, pulses of the non-interference DC signal at high level are applied to the non-interference DC switch 4 to turn off the non-interference DC switch 4 as well as to operate the non-interference DC detector 141.

Once the non-interference DC detector 141 has been operated, DC value of I axis DC(I) and DC value of Q axis DC(Q) are detected from the I channel and the Q channel digital signals received from the ADCs 12 and 13, respectively. The DC value of I axis DC(I) and DC value of Q axis DC(Q) received from the noninterference DC detector 141 are converted at the DACs 142 and 143 respectively into analog signals of DC correction values to be applied to the subtracters 10 and 11 respectively.

Since the VSB signal uses an I channel signal only, only the signal applied from the ADC 12 is received by the synchronization detector 16, and extracted of the segment synchronization corresponding to the horizontal synchronization signal of the NTSC, and the segment synchronization corresponding to the vertical synchronization signal of the NTSC is extracted at the data field synchronization detector 17.

Since, the conventional DC correction device can correct DC only at the non-interference DC detector 141 that can be operable under non-interference condition in which the IF terminal switch 4 has been turned off cutting the IF signal input, the conventional DC correction device can only correct DC once every time when turning on a TV or changing a channel.

However, since the DC offset value (that corrects DC) varies with a variation in temperature and voltage of supplied power, it should be corrected along with time.

Therefore, the conventional DC correction device has problems of causing misunderstanding of data in the I channel or mistaking of phase at phase locking in the Q channel because the DC correction device is unable to correct DC according to the DC offset value varying with time or voltage.

SUMMARY OF THE INVENTION

The object of this invention for solving the foregoing problems is to provide a DC correction device for correcting DC utilizing field synchronization data according to DC offset value which varies at every field or at every frame.

Theses and other objects and features of this invention can be achieved by providing a device for correcting DC of a HDTV, including a non-interference DC detector for detecting DC from digital signals of I channel and Q channel applied under non-interference condition in which IF signal input has been cut off, an interference DC detector for detecting DC from the digital signals of I channel and Q channel applied at every field according to data field synchronization signal applied from outside, a selection part for selecting either one of the DC value received from the non-interference DC detector and the interference DC detector, and a D/A conversion part for D/A conversion of the DC value received from the selection part.

DETAILED DESCRIPTION OF THE INVENTION

A system and operation of a device for correcting DC in accordance with this invention is to be explained hereinafter, referring to FIGS. 2, 3, 4, and 5.

Figure 1:
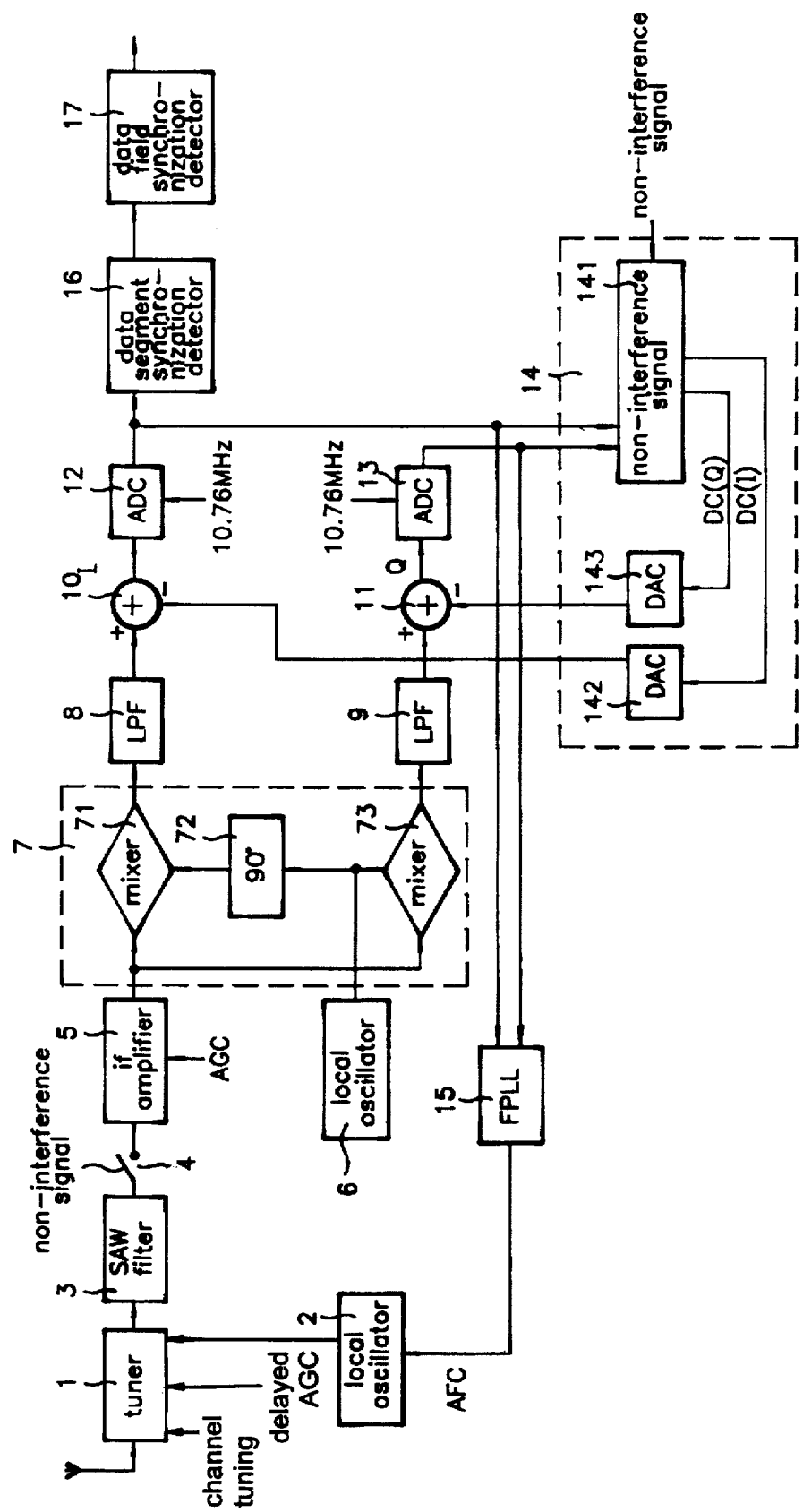
FIG. 1 is a system of a conventional HDTV receiver.
Figure 2:
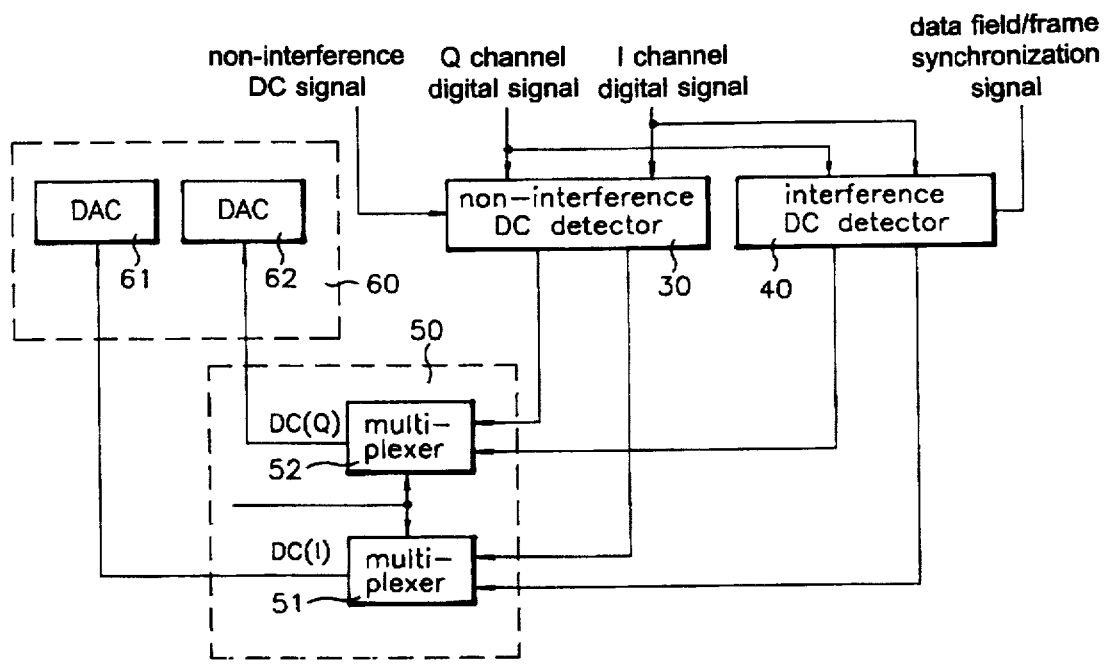
FIG. 2 is a system of a device for correcting DC in accordance with this invention.

As shown in FIG. 2, the device for correcting DC includes a non-interference DC detector 30, an interference DC detector 40, a selection part 50, and a D/A conversion part 60.

The non-interference DC detector 30 detects DCs from digital signals of an I channel and a Q channel applied under non-interference condition in which an IF signal input has been cut off.

Herein, the interference DC detector 40 can be made to detect DCs from digital signals of the I channel and the Q channel applied at every field or at every frame in response to a data field or frame synchronization signal applied from outside.

The selection part 50 includes a multiplexer 51 for selecting either one of the DC value of I axis received from the non-interference DC detector 30 and the interference DC detector 40, and a multiplexer 52 for selecting either one of the DC value of Q axis received from the non-interference DC detector 30 and the interference DC detector 40. The selection part 50 thereby can select either one of the DC value received from the noninterference DC detector 30 and the interference DC detector 40.

Herein, the control signals for controlling selection of the multiplexers 51 and 52 have non-interference DC signals showing non-interference condition.

The D/A conversion part 60 includes a DAC 61 for D/A conversion of the DC value of I axis received from the selection part 50 and a DAC 62 for D/A conversion of the DC value of Q axis received from the selection part 50. The D/A conversion part 60 thereby can carry out D/A conversion of the DC value received from the selection part 50.

Figure 3:
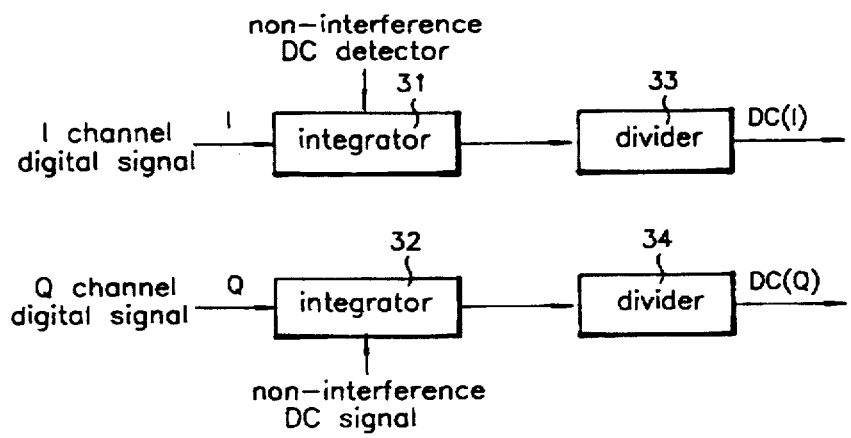
FIG. 3 is detail of a system of the non-interference DC detector of FIG. 2.

As shown in FIG. 3, the non-interference DC detector 30 includes integrators 31 and 32 for integrating the digital signals of I channel and Q channel applied as many as the number of symbols respectively in response to the non-interference DC signal showing non-interference condition, and dividers 33 and 34 for dividing the signals received from the integrators 31 and 32 by the number of symbols respectively. The non-interference DC detector 30 thereby can determine DC value by calculating average value of the digital signals of I channel and Q channel.

Figure 5:
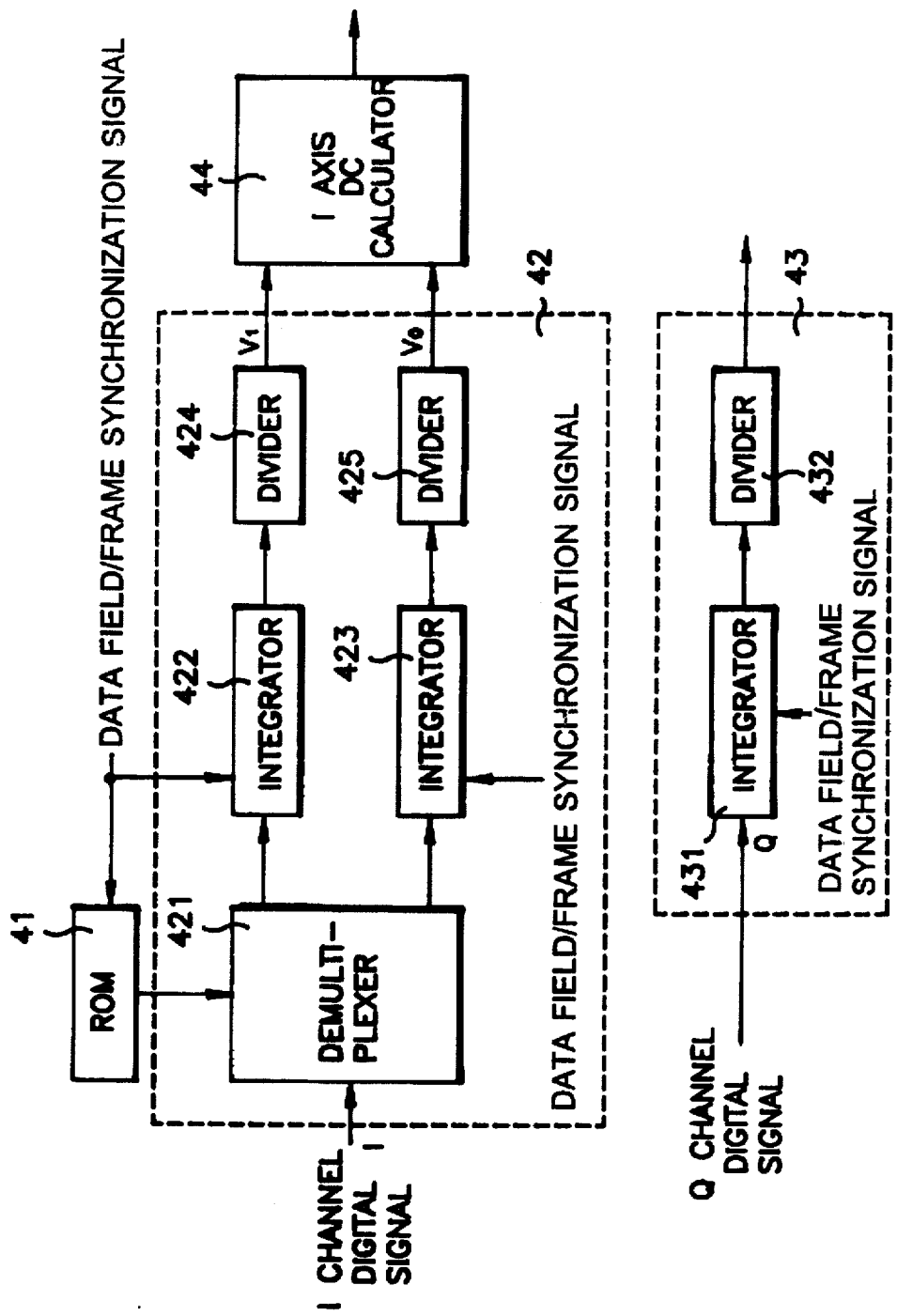
FIG. 5 is detail of a system of the interference DC detector of FIG. 2.

As shown in FIG. 5, the interference DC detector 40 includes a storage part 41 for storing the field synchronization data, a reception terminal level calculation part 42 for calculating reception terminal level of the digital signal of I channel applied in response to the data field synchronization signal applied from outside using the field synchronization data stored in the storage part 41, an I axis DC calculator 44 for calculating the DC value of the I axis using the signal received from the reception terminal level calculation part 42, and a Q axis DC calculation part 43 for calculating the DC value of Q axis from the digital signal of the Q channel applied in response to the data field synchronization signal applied from outside.

Herein, the storage part 41 has ROM(Read Only Memory).

The reception terminal level calculation part 42 includes a demultiplexer 421 for dividing the digital signal of the I channel applied according to the field synchronization data stored in the storage part 41 into '1' and '0' level, integrators 422 and 423 for integrating the '1' and '0' level signals received from the demultiplexer 421 as many as a half of the number of symbols N/2 respectively in response to the data field synchronization signal applied from outside, and dividers 44 and 45 for dividing the signals received from the integrators 422 and 423 by a half of the number of symbols N/2.

The Q axis DC calculation part 43 includes an integrator 431 for integrating the digital signal of the Q channel applied in response to the data field synchronization signal applied from outside as many as the number of symbols N, and a divider 432 for dividing the signal received from the integrator 431 by the number of symbols N.

Operation detail of the DC correction device having the foregoing system is to be explained hereinafter.

First, when the pulse of a non-interference DC signal is at high level under a condition that the signal received through an antenna has been modulated into base band signal and converted into digital signal through the mixers, base band amplifiers, and ADCs, the non-interference DC detector is operated. That is, upon detection of DC from the digital signals of I channel and Q channel applied under non-interference condition in which the IF signal input has been cut off, and production of the DC value of I axis DC(I) and the DC value of Q axis DC(Q), the produced DC value of I axis DC(I) and DC value of Q axis DC(Q) are applied to the multiplexers 51 and 52.

Processes for producing the DC value of the I axis DC(I) and the DC value of the Q axis DC(Q) under non-interference conditions are to be explained hereinafter, referring to FIG. 3.

When the pulse of the non-interference DC signal is at a high level, the digital signals of I channel are integrated at the integrator 31 as many as the number of symbols N corresponding to the pulses of the non-interference DC signal to increase SNR (Signal to Noise Ratio), divided again at the divider 33 by the number of symbols N, and applied to the multiplexer 51 as the DC value of I axis DC(I).

When the pulse of the non-interference DC signal is at high level, the digital signals of Q channel are integrated at the integrator 32 as many as the number of symbols N corresponding to the pulses of the non-interference DC signal to increase SNR, divided again at the divider 34 by the number of symbols N, and applied to the multiplexer 52 as the DC value of the Q axis DC(Q).

The DC value of the I axis DC(I) and the DC value of the Q axis DC(Q) received from the dividers 33 and 34 of the noninterference DC detector 30 are selected at the multiplexers 51 and 52 of the selection part 50 and applied to the D/A conversion part 60, respectively.

In this instant, the control signal for controlling selection of the multiplexers 51 and 52, being a non-interference DC signal applied from outside, controls the multiplexers 51 and 52 to select the DC value of the I axis DC(I) and the DC value of the Q axis DC(Q) received from the dividers 33 and 34 of the non-interference DC detector 30 under non-interference condition in which the IF signal input has been cut off due to the pulse input of the non-interference DC signal being at high level.

The DC value of the I axis DC(I) received from the multiplexer 51 is converted into an analog signal at the DAC 61 and applied to the I channel subtractor used for DC correction. And the DC value of Q axis DC(Q) received from the multiplexer 52 is converted into an analog signal at the DAC 62 and applied to the Q channel subtractor, used for DC correction.

When the I channel signal received after being corrected of the DC value under non-interference condition in the foregoing processes is converted into digital signal and extracted of data segment synchronization and data field synchronization, a data field synchronization signal or a data frame synchronization signal can be generated at the data field synchronization detector.

The extracted data field synchronization signal or data frame synchronization signal is applied to the interference DC detector 40 for operation of the interference DC detector 40 to detect DC value once at every field or once at every frame.

Herein, the interference DC detector 40 should be controlled operable in response to the data field synchronization signal for detection of the DC value at every field, and should be controlled operable in response to the data frame synchronization signal for detection of the DC value at every frame.

When the data field synchronization signal or the data frame synchronization signal is applied, the interference DC detector 40 is operated, detecting DC from the digital signals of I channel and Q channel applied under interference condition in which the IF signal input has not been cut off, and producing the DC value of the I axis DC(I) and the DC value of the Q axis DC(Q), which is applied to the multiplexers 51 and 52.

Processes for producing the DC value of the I axis DC(I) and the DC value of the Q axis DC(Q) under non-interference condition are to be explained hereinafter, referring to FIGS. 4 and 5.

The storage part 41 stores 512 field synchronization data having same number of '0' and '1'.

Figure 4:
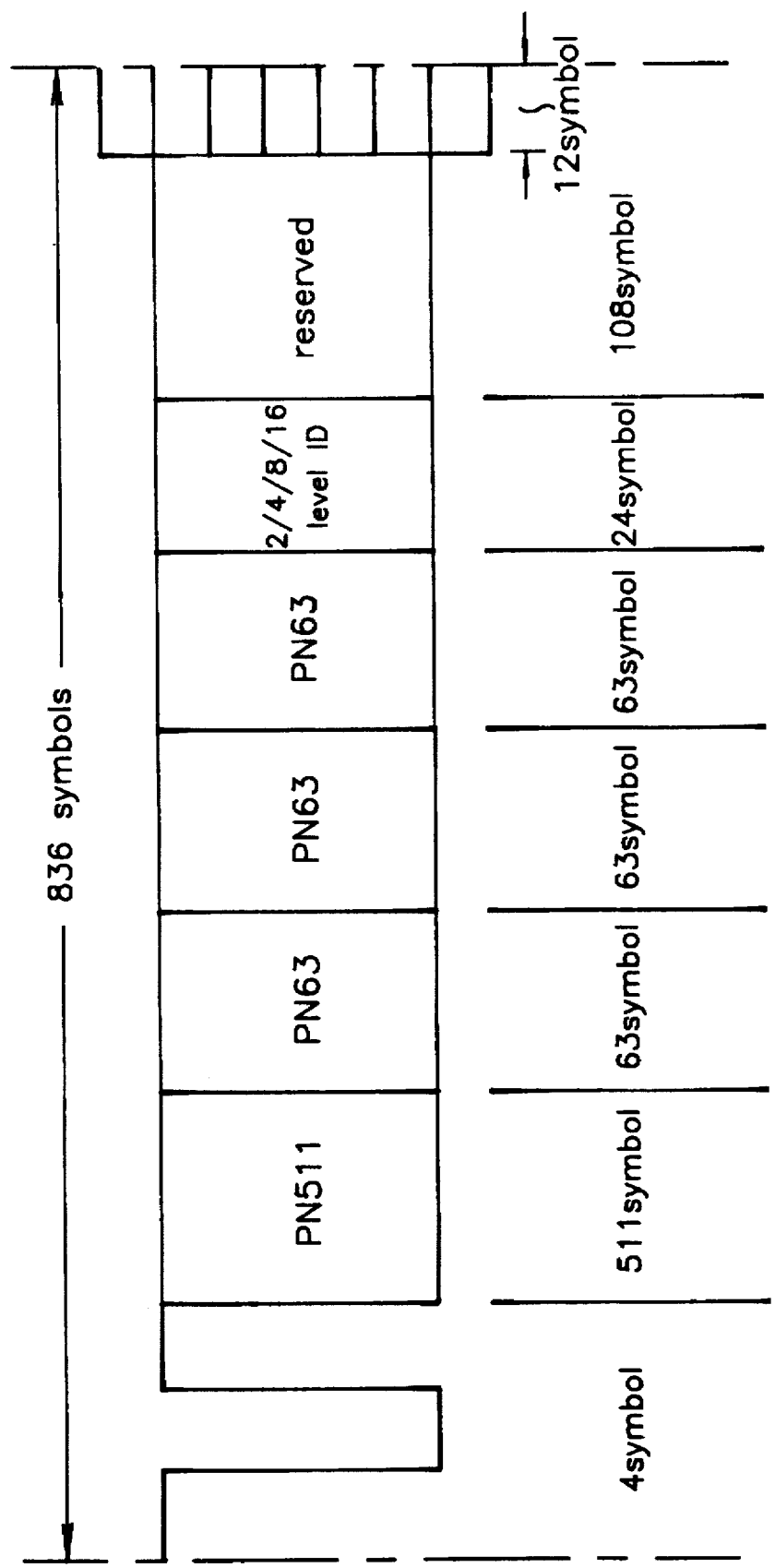
FIG. 4 shows a pattern of field synchronization data.

As shown in FIG. 4, the field synchronization data has a segment synchronization pattern of '1001' as the first four symbols, pseudo random sequence of PN 511, PN 63, PN 63, and PN 63 at the next, basic levels of 2/4/6/8 level ID for 2, 4, 6, and 8 levels at the third, and a reserved area at the last.

Herein, the field synchronization data consists of two levels except the last symbol level.

The field synchronization data intended to use at the interference DC detector 40 is even numbered data having the same number of '1' and '0' in already known PN sequence.

Herein, in order to produce even numbered data out of the 511 data of the PN 511, either the first or the last data of the 511 data is excluded to make 510 data, or one more data is added in front of or at the end of the 511 data to make 512 data.

When it is intended to make 512 data, a number of exponential times of 2, for the convenience of calculation, by adding one more data in front of, or at the end of the PN 511, 512 data having same number of '1' and '0' can be made.

In this instant, in case the numbers of '1' and '0' of the 512 data is not the same, at selection of consecutive 512 data of the total 700 data of PN 511, PN 63, PN 63, and PN 63, the data can be selected so that the number of '1' and the number of '0' are the same. When it is hard to do so, number of data of 256, or 128, or 64 can only be selected.

Operation of the interference DC detector 40 using a field synchronization data pattern is to be explained hereinafter.

When a field synchronization data is transmitted after making the '1' at +5 magnitude and the '0' at −5 magnitude of the 2 levels of the transmission level of the field synchronization data, pilot is added by 1.25.

Therefore, if V1 is taken as a reception terminal level of a digital signal of the I channel received from the ADC when '1' is transmitted from a transmission terminal, and V0 is taken as the reception terminal level of the digital signal of the I channel received from the ADC when '0' is transmitted from the transmission terminal, $$V1=(5+1.25)A+DC, \quad \text{equation 1}$$

and $$V0=(-5+1.25)A+DC, \quad \text{equation 2}$$

where A is amplification factor, then the DC value will be, $$DC=(5/2)V0-(3/2)V1. \quad \text{equation 3}$$

Accordingly, since the field synchronization data transmitted from the transmission terminal is already known, while having the known field synchronization data stored in the storage part 41, the DC value can be calculated according to equation 3 through dividing the field synchronization data received at the reception terminal into two levels based on the known field synchronization data irrespective of the magnitude of the field synchronization data received at the reception terminal.

That is, upon application of the data field synchronization signal, the storage part 41 transmits the stored 512 field synchronization data to the demultiplexer 421, and the digital signal input of I channel is demultiplexed at the demultiplexer 421 according to the field synchronization data stored in the storage part 41 and applied to the integrators 422 and 423, respectively.

In other words, at identification of the transmitted data of being '1' level or '0' level, the field synchronization data stored in the storage part 41 controls the demultiplexer 421 to apply the digital signal input to the integrator 422 if the transmitted data has been a transmission of '1' level, and controls the demultiplexer 421 to apply the digital signal input to the integrator 423 if the transmitted data has been a transmission of '0' level.

The digital signal of I channel having transmitted '1' level received from the demultiplexer 421 is integrated at the integrator 422 as many as one half N/2 of the total number of symbols, divided again at the divider 424 by one half N/2 of the total number of symbols, and becomes the signal of the reception terminal level V1 for the case that the transmission terminal has transmitted '1' level, which is applied to the I axis DC calculator 44.

And the digital signal of I channel having transmitted '0' level received from the demultiplexer 421 is integrated at the integrator 423 for as many as one half N/2 of the total number of symbols, divided again at the divider 425 by one half N/2 of the total number of symbols, and becomes the signal of the reception level V0 for the case that the transmission terminal has transmitted '0' level, which is applied to the I axis DC calculator 44.

The reception terminal levels V1 and V0 of the signals received from the dividers 424 and 425 are calculated at the I axis DC calculator 44 according to the equation 3, and transmitted as the DC value of the I axis DC(I).

That is, according to, $$DC=(5/2)V0-(3/2)V1 \quad \text{equation 3,}$$

the DC value of I axis DC(I) is calculated at the I axis DC calculator 44 and transmitted to the multiplexer 51.

If the numbers of '1' and '0' are the same, since there is no pilot in Q channel due to the properties of VSB, the average of the data will be '0'.

Therefore, if the digital signal of a channel is added as many as the number of symbols N and divided by the number of symbols N, the DC value of Q the axis DC(Q) can be obtained.

That is, when the data field synchronization signal is applied, the integrator 431 is operated to integrate the digital signals of the Q channel at the integrator 431 as many as the number of symbols N, which are divided at the divider 432 by the number of symbols N and transmitted to the multiplexer 52 as the DC value of the Q axis DC(Q).

In this instant, to reduce error, it is desirable to take 512 data as far as possible.

Since the pulse of the non-interference DC signal will be at the low level due to interference, the control signal controls the multiplexers 51 and 52 of the selection part 50 to select the DC value of the I axis DC(i) and the DC value of the Q axis DC(Q) applied from the interference DC detector 40, respectively.

The DC value of I axis DC(I) selected at and received from the multiplexer 51 is converted into an analog signal at the DAC 61, applied to the I channel subtracter, and used for the DC correction.

And the DC value of the Q axis DC(Q) selected at and received from the multiplexer 52 is converted into analog signal at the DAC 62, applied to the Q channel subtracter, and used for the DC correction.

In other words, in case a TV is turned on for the first time or a channel is changed, the DC value of the I axis DC(I) and the DC value of the Q axis DC(Q) received from the non-interference DC detector 30 are selected at the multiplexers 51 and 52, whereas, after fixation of the data field synchronization signal, i.e., in case the TV is watched fixed to a channel, the DC value of the I axis DC(I) and the DC value of the Q axis DC(Q) are detected at the interference DC detector 40 once at every field or once at every frame, and selected at the multiplexers 51 and 52.

As has been explained, this invention has an advantage of correcting the DC value varying along with time using field synchronization data without turning the switch of IF terminal off.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

What is claimed is:

1. A device for correcting DC of a HDTV comprising:
   a non-interference DC detector for detecting DC from digital signals of an I channel and a Q channel applied under a non-interference condition in which an IF signal input has been cut off;
   an interference DC detector for detecting DC from the digital signals of the I channel and the Q channel applied at every field according to a data field synchronization signal applied from outside;

a selection part for selecting one of the DC values received from the non-interference DC detector and the interference DC detector; and, a D/A conversion part for D/A conversion of the selected DC value received from the selection part.

2. The device for correcting DC of a HDTV as claimed in claim 1, wherein the selection part includes:

a first multiplexer for selecting one of the DC value of the I axis received from the non-interference DC detector and the interference DC detector, and a second multiplexer for selecting one of the DC value of the Q axis received from the non-interference DC detector and the interference DC detector.

3. The device for correcting DC of a HDTV as claimed in claim 2, wherein, each of the control signals for controlling selection of the first, and the second multiplexers has a noninterference DC signal showing the non-interference condition.

4. The device for correcting DC of a HDTV as claimed in claim 1, wherein the D/A conversion part includes:

a first DAC for D/A conversion of the DC value of the I axis received from the selection part, and a second DAC for D/A conversion of the DC value of the Q axis received from the selection part.

5. The device for correcting DC of a HDTV as claimed in claim 1, wherein the non-interference DC detector includes:

a first integrator and a second integrator for integrating the digital signals of the I channel and the Q channel for as many as the number of symbols respectively in response to the non-interference DC signal showing the non-interference condition, and a first divider and a second divider for dividing the signals received from the first, and the second integrators by the number of symbols respectively.

6. The device for correcting DC of a HDTV as claimed in claim 1, wherein the interference DC detector includes:

a storage part for storing the field synchronization data, a reception terminal level calculation part for calculating reception terminal level of the digital signal of the I channel applied in response to the data field synchronization signal applied from outside using the field synchronization data stored in the storage part, an I axis DC calculator for calculating the DC value of the I axis using the signal received from the reception terminal level calculation part, and a Q axis DC calculation part for calculating the DC value of the Q axis from the digital signal of the Q channel applied in response to the data field synchronization signal applied from outside.

7. The device for correcting DC of HDTV as claimed in claim 6, wherein the reception terminal level calculation part includes:

a demultiplexer for dividing the digital signal of the I channel applied according to the field synchronization data stored in the storage part into a '1' and a '0' level, a first integrator, and a second integrator for integrating the '1' and '0' level signals received from the demultiplexer for as many as a half of the number of symbols N/2 respectively in response to the data field synchronization signal applied from outside, and a first divider and a second divider for dividing the signals received from the integrators by a half of the number of symbols N/2, respectively.

8. The device for correcting DC of a HDTV as claimed in claim 6, wherein the storage part has ROM(Read Only Memory).

9. The device for correcting DC of a HDTV as claimed in claim 6, wherein the storage part stores 512 field synchronization data.

10. The device for correcting DC of a HDTV as claimed in claim 9, wherein the 512 field synchronization data has same number of '0' and '1'.

11. The device for correcting DC of a HDTV as claimed in claim 6, wherein the Q axis DC calculation part includes:

an integrator for integrating the digital signal of the Q channel applied in response to the data field synchronization signal applied from outside for as many as the number of symbols N, and a divider for dividing the signal received from the integrator by the number of symbols N.

12. A device for correcting DC of a HDTV comprising:

a non-interference DC detector for detecting DC from digital signals of an I channel and a Q channel applied under a non-interference condition in which an IF signal input has been cut off;

an interference DC detector for detecting DC from digital signals of the I channel and the Q channel applied at every frame in response to a data frame synchronization signal applied from outside;

a selection part for selecting one of the DC values received from the non-interference DC detector and the interference DC detector; and a D/A conversion part for D/A conversion of the selected DC value received from the selection part.

* * * * *